(12) United States Patent
Bernal et al.

(10) Patent No.: US 6,281,993 B1
(45) Date of Patent: Aug. 28, 2001

(54) PHASE SHIFTING ELEMENT FOR OPTICAL INFORMATION PROCESSING STORING SYSTEMS

(75) Inventors: Maria-Pilar Bernal, Santa Cruz; Hans Jürgen Coufal, San Jose; Robert Keith Grygier, San Diego; Carl Michael Jefferson, San Jose, all of CA (US); Egbert Oesterschoze, Kassel (DE); Kenneth Francis Walsh, Lima, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/050,847

(22) Filed: Mar. 30, 1998

(51) Int. Cl.$^7$ ....................................................... G03H 1/16
(52) U.S. Cl. ................................. 359/29; 359/20; 359/11; 369/103
(58) Field of Search ................................. 359/15, 20, 21, 359/22, 11, 30; 365/24, 25; 369/102, 103, 112; 385/33

(56) References Cited

U.S. PATENT DOCUMENTS

| | | |
|---|---|---|
| 3,891,975 | 6/1975 | Deml et al. . |
| 3,924,924 | 12/1975 | Fukuhara . |
| 3,995,948 | 12/1976 | Abe et al. . |
| 4,143,937 | 3/1979 | Yonezawa et al. . |
| 4,318,581 | 3/1982 | Guest et al. . |
| 5,052,772 | * 10/1991 | Okamoto et al. ........................ 385/33 |
| 5,132,813 | 7/1992 | Caulfield et al. . |
| 5,502,581 | 3/1996 | Sudo et al. . |
| 5,510,912 | 4/1996 | Blaum et al. . |
| 5,621,549 | 4/1997 | Redfield . |
| 5,760,932 | * 6/1998 | Perchak ................................. 359/15 |

OTHER PUBLICATIONS

C.B. Burckhardt; "Use of a Random Phase Mask for the Recording of Fourier Transform Holograms of Data Masks"; *Applied Optics*; Mar. 1970; vol. 9, No. 3; pp. 695–700.

B. Hill; "Some Aspects of a Large Capacity Holographic Memory"; *Applied Optics*; Jan. 1972; vol. 11, No. 1; pp. 182–191.

W.C. Stewart, A.H. Firester, and E.C. Fox; "Random Phase Data Masks; Fabrication Tolerances and Advantages of Four Phase Level Masks"; *Applied Optics*; Mar. 1972; vol. 11, No. 3, pp. 604–608.

W. J. Dallas; "Deterministic Diffusers for Holography"; *Applied Optics*; Jun. 1973; vol. 12, No. 6; pp. 1179–1187.

D.G. Esaev, A. A. Lorei, and S.P. Sinitsa; "Continuous random phase mask"; *Sov. Phys. Tech. Phys.*; Sep. 1977; 22(9); pp. 1150–1152.

Akito Iwamoto; "Artificial diffuser for Fourier transform hologram recording"; *Applied Optics*; Jan. 1980; vol. 19, No. 2; pp. 215–221.

Yoshikazu Nakayama and Makoto Kato; "Linear recording of Fourier transform holograms using a pseudorandom diffuser"; *Applied Optics*; Apr. 1982; vol. 21, No. 8; pp. 1410–1418.

* cited by examiner

*Primary Examiner*—Darren Schuberg
*Assistant Examiner*—Fayez Assaf
(74) *Attorney, Agent, or Firm*—Thomas R. Berthold; Robert B. Martin

(57) ABSTRACT

Optical information processor and storage of pixelated data pattern in a Fourier plane of a lens as achieved by a plurality of optical elements operating with a spatial light modulator. A laser light source illuminates a data pattern with a wavefront that is created by a phase mask to effect a phase shift. The optical information can be effecitvely processed or stored, for instance, in a holographic data storage system. The holographic data storage system for storing a data array contains illuminated and dark regions including a multi-fold phase shift mask. This affects a linear and non-random shift of an image. The image is stored on a holographic storage medium. There is a spatial light modulator between the input location for the optical data and the storage medium. The phase shift is effected in the Fourier plane.

7 Claims, 17 Drawing Sheets

$\alpha$ : Angle of the axicon
n : Index of refraction of the axicon
r : Radius of the outermost ray $\Phi_{SLM}$ : Largest SLM dimension d′ : Tolerance region of the location of the SLM with respect to the axicon $$d' = \frac{r}{(n-1)\alpha}$$

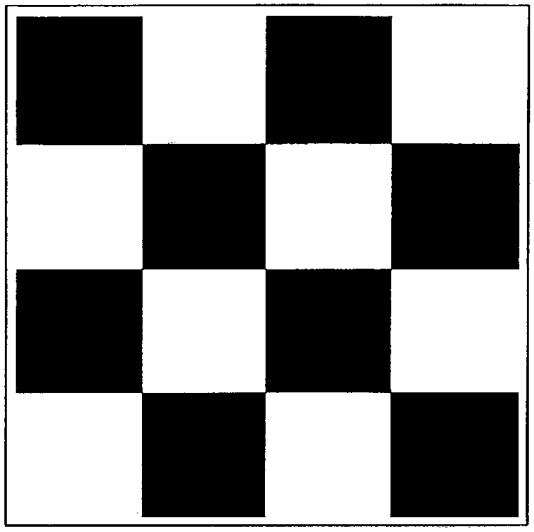 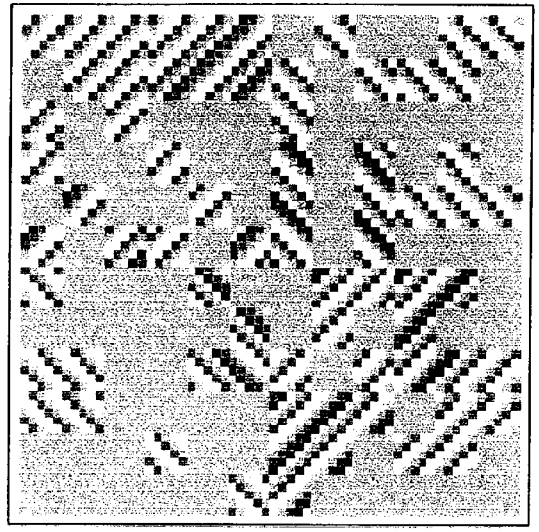
FIG. 12A   FIG. 12B
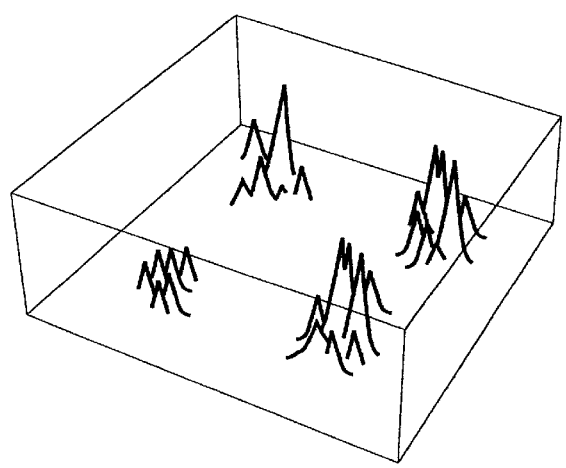
FIG. 12C

PHASE SHIFTING ELEMENT FOR OPTICAL INFORMATION PROCESSING STORING SYSTEMS

The U.S. Government has a paid-up license in this invention and the right in limited circumstances to require the patent owner to license others on reasonable terms as provided for by the terms of contract No. MDA-972-95-3-0004 awarded by The Advanced Research Projects Agency.

BACKGROUND OF THE INVENTION

Optical information processor and storage of pixelated data pattern in a Fourier plane of a lens is achieved by a plurality of optical elements operating with a spatial light modulator. A laser light source illuminates a data pattern with a wavefront that is created by a phase shifting element to effect a phase shift. The optical information can be effectively processed or stored, for instance, in a holographic data storage system.

1. Field of the Invention

This invention is concerned with optical information processing or storage of a pixelated data pattern. In particular, the invention is directed to phase shifting this data in a Fourier plane of an optical system, preferably a lens. This invention is directed to the illumination of the data pattern with a wavefront that is created by a particular phase shifting element to effect optical data processing and optical data storage, particularly holographic data storage.

2. Description of the Related Art

Digital holographic optical data storage devices for high density and high data rate storage devices and video server is highly desirable. It is also desirable to process optical data in a manner that is highly efficient and effective even when there is no storage involved. Such systems are optical correlators, and it is desirable for these to permit for efficient high density correlation.

A known storage device involves storing the data as a series of Fourier transform holograms in a photorefractive or photochromic crystal or photopolymer. Each data page is constructed using a spatial light modulator (SLM) which is a liquid crystal display or a flexible silicon mirror array. The digital 1's and 0's that are to be stored are represented by individual pixels of the SLM respectively. Due to the regular spacing of pixels on the SLM and to the fact that coherent light is used in recording the holograms, large intensity spikes appear in the Fourier transform plane where the holograms are recorded. These spikes are extremely detrimental to the hologram recording process and significantly reduce the dynamic range of the material available for recording holograms and, therefore, substantially reduce the amount of data that can be stored per unit volume.

The desired distributions of intensity in the Fourier transform plane for the most likely devices namely having Gaussian distributions or uniform distributions. These distributions may be achieved under certain critical limiting circumstances with a phase shifting element consisting of randomly distributed phase pixels having either 0 or a fraction of $\pi$ phase shifts. However, the phase pixels are desirably of the same size and periodicity as the SLM pixels and must accurately register with the SLM pixels. They must also be very accurate multiples of $\pi$ phase shifts for the best performance.

This type of discrete phase step mask should either be in very close proximity or be imaged to be in very close proximity with the SLM to avoid diffraction effects which can deteriorate the reconstructed image of the data. It is difficult and expensive to make and align such a system. Several variations of this general type of phase shifting element have been proposed but all have similar difficulties.

The invention provides a set of phase shifting element designs which avoid most of the difficulties of manufacturing, positioning and alignment of random phase shifting elements but which allow the light intensity in the Fourier plane to be distributed in a more uniform manner. These phase shifting elements should be inexpensive, easily aligned and should be capable of being incorporated directly on the SLM or can be designed to work with a reflective SLM.

During the 1970s and early 1980s, considerable work had been done on random phase masks for Fourier transform holographic storage. A number of researchers investigated the use of discrete random phase steps. C. B. Burckhardt, "Use of a Random Phase Mask for the Recording of Fourier Transform Holograms of Data Marks," Appl. Optics, 1970, 9, 695–700; B. Hill, "Some Aspects of a Large Capacity Holographic Memory," Appl Optics, 1972, 11, 182–191; W. C. Stewart, "Random Phase Data Mask: Fabrication Tolerances and Advantages of Four Phase Level Marks," Appl. Optics, 1972, 11, 604–608; W. J. Dallas, "Deterministic Diffusers for Holography," Appl. Optics, 1973, 12, 1179–1187; and Y. Nakayama, "Linear Recording of Fourier Transform Holograms Using a Pseudorandom Diffuser," Appl. Optics, 1982, 21, 1410–1418. The contents of all the references herein are incorporated by reference herein.

Two level masks consisting of randomly distributed phase mask with 0 and $\pi$ phase shifts for each data pixel were studied. In addition, four, six and higher level masks were studied and compared with the two level masks. These studies showed that the random phase mask could smooth the Fourier transform of an image and retrieve the data with good image fidelity if the phases were placed at the data mask location and if the phase pixels are exactly aligned and registered with the data mask. However, it is extremely difficult to place convectional phase masks exactly at the SLM and alignment and spacing is an issue that causes the image to be degraded by diffraction effects.

Continuous random phase masks were studied by D. G. Esaev, "Continuous Random Phase mask," Sov. Phys. Tech. Phys., 1977, 9, 1150–1152, which is incorporated by reference herein. Esaev showed that continuous random phase pixels would accomplish the same smoothing. A. Iwamoto, "Artificial Diffuser for Fourier Transform Hologram Recording," Appl. Optics, 1980, 19, 215–220, which is incorporated by reference herein, proposed a phase mask of random pixels but where the phase variation is of a higher spatial frequency than the data pixels and where the phase variation is continuous and smooth rather than having discrete steps. However, the phase pixels in both these masks have the same alignment, registration and interference difficulties as the two and multiple level masks.

This field of phase masks research seems to have been abandoned during the 1980s and has not been of interest until the 1990s when the enabling technologies required for holographic storage have finally become available.

The invention seeks to use phase shifting elements in holographic storage so as to provide an enhanced storage system, product and procedure.

SUMMARY OF THE INVENTION

To overcome the problems discussed above, and to overcome other problems in the art, the present invention discloses a phase shifting device which is provided for use in Fourier transform holographic data storage. This phase shifting element has linear variations and phase may be placed at different positions in the optical train so that it does relate to the SLM effectively. The phase shifting element of the invention is directed to creating a substantially linear phase shift and revolution symmetry around the optical axis of illumination of a data mask. This phase shifting element includes an axicon. An axicon is a device which relates to a cone configuration.

Other phase shifting elements in the category of the invention include a multi-fold phase shifting element. This can be a mask which is substantially linear in its characteristics. Thus, a linear phase shifting element would act to cause a linear phase shift, namely, a shift of the peak at the Fourier plane. The invention is concerned with a mask which effects a linear phase shift.

Ideally, such a phase shifting device creates a substantial revolution symmetry. The phases could be 2, 3, 4, 5, 6, 7, 8 fold, etc., namely, an integer number. The device for effecting this infinite fold increase is termed the axicon.

The axicon, in a side view cross-section, is formed by infinite straight edges which extend from the upstream side of the phase shifting element towards the pointed side, namely, the downstream side. This configuration can be seen in the evolvement of the phase shifting element from the two-fold version to the multi-fold phase shifting element format.

With this invention there is provided an optical information processing system which comprises a coherent light source such as a laser. There is an SLM with a two-dimensional array of light transmitting and non-transmitting regions thereby forming pixels. The phase shifting device consists of an element which has a plurality of prismatic elements, and which is imaged or located in relation to the SLM with such dimensions that the area of the majority of the prismatic elements is greater than the average area of each light-transmitting region. As such, most, if not all, of the elements extend beyond the general area formed by most, if not all, of each of the light-transmitting regions on an average. The phase shift caused by these prismatic elements across any light-transmitting region is substantially less than a quarter of a wavelength of the light source which is preferably coherent light in the form of a laser. The minimum phase shifting element angle has to be large enough to separate the center of two high intensity peaks (coming from the SLM page) by a distance at least equal to the width of one peak. The maximum angle can be obtained as follows: If the medium side that encounters the data-bearing beam is assumed to be of square shape and linear dimension D, the maximum angle of the prismatic elements must be such that the outermost ray going through the recording medium is contained in the square. This can be mathematically expressed as:

$$\frac{\lambda}{\frac{N\delta}{(n-1)}} \leq \alpha \leq \frac{D}{2f(n-1)}$$

where λ is the laser wavelength, N is the number of pixels in one dimension contained in the SLM, δ is the linear periodicity of the SLM pixels, n is the index of refraction of the material, D is the linear dimension of the recording medium, and f is the focal length of the imaging system.

In the relationship described, the prismatic elements are located selectively in adjacency relative to the SLM or can be relatively moved from the SLM. There can be a condenser for illuminating the SLM with the light source, which is coherent light in the form of a laser. Additionally, there can be optical means for imaging the phase shifted light into the spatial light modulator. The spatial light modulator can be of a reflective nature.

In one form of the invention, there is provided a system, method and apparatus for holographic data storage and retrieval. The data was provided for storage from an array containing illuminated and dark regions. There is a spatial light modulator (SLM) for generating an image for storage and a phase shifting element for affecting a substantially linear and substantially non-random shift of the image. This phase shifting element treated image is stored on a holographic storage medium such as a photorefractive crystal. There are means for retrieving the optical phase shifted data from the medium.

In other forms of the invention, the multi-fold phase shifting element is one which has selectively at least a two-fold or multiple of one-fold phase shifting device located between the laser source and the input data.

In yet other forms of the invention there can be correlation systems to compare data patterns. For instance, an input pattern with regard to a stored pattern in a crystal.

BRIEF DESCRIPTION OF THE DRAWINGS

Referring now to the drawings in which the reference numbers represent corresponding elements throughout:

FIGS. 12a–12c illustrate an application of the 4-fold phase shifting element wedge in combination with a checkerboard phase shifting element;

DETAILED DESCRIPTION OF THE PREFERRED EMBODIMENTS

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

A Holographic Storage System

Prior to the discussion of the method and apparatus of the present invention, an overview of a hologram storage system wherein the present invention finds its uses should initially be introduced. A general schematic of a volume hologram system is illustrated in FIGS. 1a and 1b which are diagrams using a holographic storage system having a multiplexer 40.

Figure 1A:
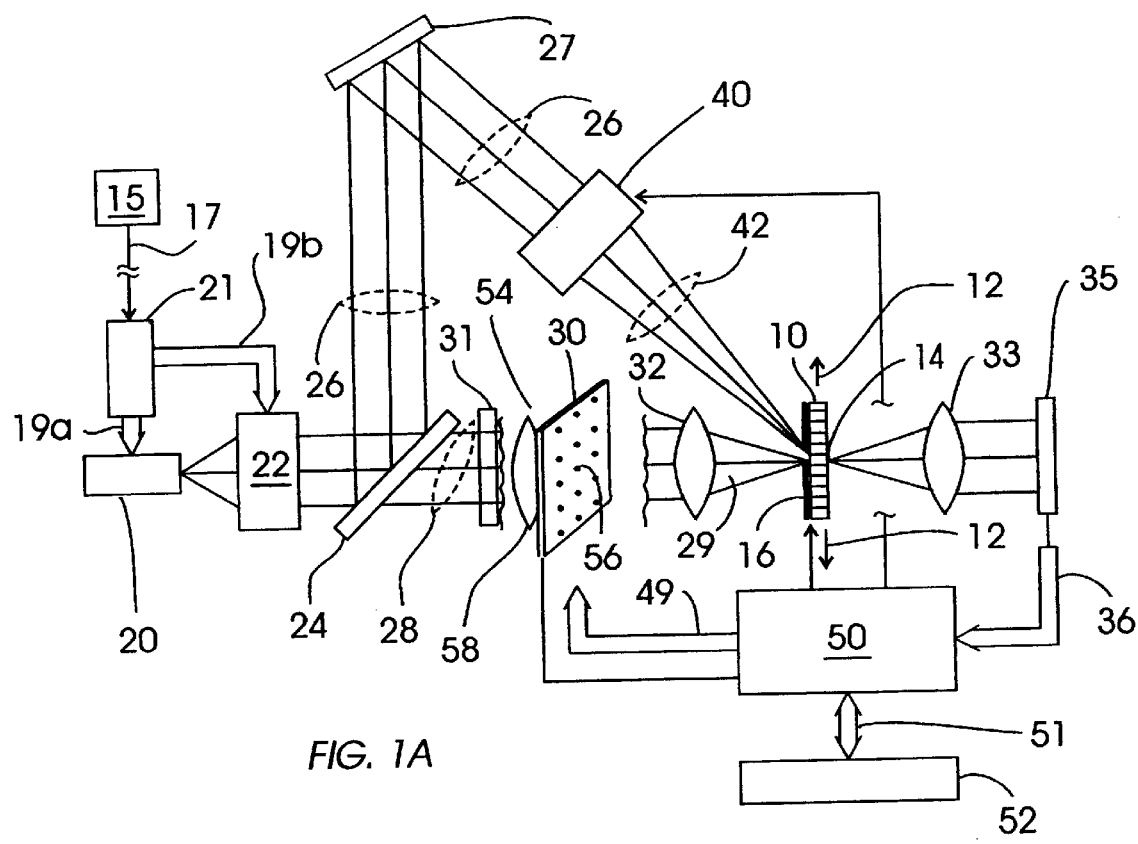
FIGS. 1a, 1b, and 1c are schematic block diagrams illustrating the major components of a volume holographic storage system.
Figure 1B:
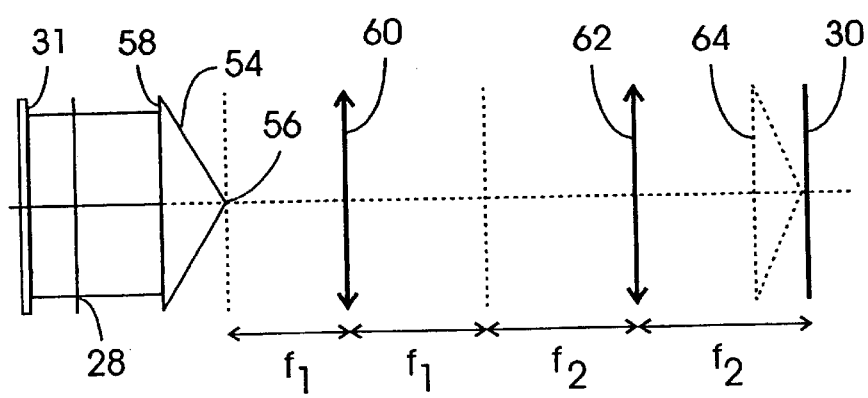

In FIG. 1a, the holographic recording medium 10 is a thick film recording material which can be composed of a suitable crystal. It is movable along an axis in the directions shown by the arrows 12 so that individual discrete sections of the medium 10, such as section 14, may be located in front of a fixed mask 16 through which the light may enter along an optical axis. The data to be stored enters the modulation unit 21 of the present invention from a data source 15 over line 17. The data source 15 being any data generation or transmission device the data from which is to be stored on the holographic medium 10. The modulation unit 21 modulates the data in accordance with the techniques of the present invention and transmits the modulated data arrays over bus 19a to affect the light source 20 and over bus 19b to affect the beam-forming optics 22. It should be understood that a specific implementation may vary, wherein the modulator of the present invention is connected/interfaced with a holographic system in other manners so long as the data to be stored in the holographic medium is modulated by the techniques disclosed herein.

A light source 20 generates a single monochromatic, coherent light beam that is directed through a set of beam-forming optics 22 which expand and collimate the output from the light source. The single-beam output from the beam-forming optics is then split by a conventional beam splitter 24 into a reference beam 26 and an object or signal beam 28.

A page composer or spatial light modulator (SLM) 30 and a Fourier transform lens 32 are located in the signal beam between the light source and the medium.

Upstream from the SLM 30 there is located the axicon phase shift device 54. In this arrangement, the SLM operates in transmission geometry mode. Accordingly, light comes along on optical axis from the back side of the SLM 30 and leaves from the front. The axicon phase shift device 54 as illustrated in FIG. 1a, is a situation where the downstream 56 is adjacent to the base phase of the Axicon 30. The upstream plane 58 is removed from the back side of the SLM 30. The downstream 56 is in as close a position to the base or back side of the SLM 30 as possible. In such a situation there may be no cover glass to the SLM 30.

As illustrated in FIG. 1b there is a situation where the axicon cannot get in adjacent relationship to the SLM 30. In this event, there is a telescopic lens system 60 and 62 which is provided between the axicon 54 and the SLM 30. In this manner a $f_1/f_2$ image 64 of the axicon (where $f_1$ and $f_2$ are the focal lengths of the first and second lenses in the telescopic system) 54 falls on the SLM plane as illustrated on SLM 30. The telescopic lenses 60 and 62 are placed in relationship between the Axicon 54 and the SLM 30, such that the focal length of the lenses is shown as $f_1$ and $f_2$ as illustrated in FIG. 1b. The spatial light modulator 30 is a two-dimensional array of shutters which either permit or block part of the signal beam The lens 32 is located a focal distance from both the spatial light modulator 30 and the holographic medium 10 to form the Fourier transform of the light distribution impressed by spatial light modulator 39 in the signal beam onto designated recording section 14 of the recording medium 10. The lens 32 thus takes the point sources of light which come from spatial light modulator 30 diverging beams of light and directs them to the medium 10 as parallel beams. Each parallel beam corresponds to light transmitted through one of the cells of the two-dimensional array of the spatial light modulator 30. These individual beams become signal beam 29 and arrive at different angles at the medium 10 from lens 32 to overlap at the recording section 14 of the medium 10.

The reference beam 26, which is split by the beam splitter 24, is directed by a mirror 27 through the multiplexer 40 and onto the recording section 14 of the medium 10. Both the output reference beam 42 from the multiplexer 40 and the individual beams 29 from the Fourier lens arrive simultaneously and interfere with one another in the medium A shutter 31 is located in the path of the signal beams 28 between the beam splitter 24 and the spatial light modulator 30, for the blocking of the signal beam 28 during reconstruction of the recorded hologram An inverse Fourier transform lens 33 is located on the side opposite the recording medium from the lens and is spaced a focal distance from the medium 10 and from a data detractor array 35. The data retrieved from the medium 10 is reconstructed by the movement of the shutter 31 into the signal beam 28 so that only the reference beam is directed to the recording section 14 of the medium 10 as to generate the transform image of the recorded hologram that is directed to the detector array 35. The detector array 35 has the same two-dimensional array pattern as the spatial light modulator 30 so that its output corresponds to the data output of the spatial light modulator 30.

A controller 50 receives data from a data bus 51 connected to the host central processing unit 52 (CPU) and transmits that data as a page of digital data to the spatial light modulator 30 via bus 49. The controller 50 also receives data output from the data detector array 35 via data bus 36 and directs it back to the CPU via a bus 51. The data controller 50 is also electrically connected to the shutter 31, multiplexer 40 and the movable recording medium 10.

To record a first page of data into the recording sections 14 of the medium 10, the data controller 50 moves the shutter 31 out of the path of the signal beam 20, translates the storage medium 10 so that the designated recording section 10 is in alignment with the opening mask 16 and signals the multiplexers. If the multiplexer 40 is an angular multiplexing device, it is moved to its first angular position. The data making up the first page is then recorded in the recording section 14 of the medium 10 by the interference of the reference beam with the signal beam that has passed through the spatial light modulator 30 whose array has received the page of data from the controller 50. To record the next page in the same section 14 of the recording medium 10, the controller 50 signals the multiplexer to move its next angular position, and the second page is recorded in the same fashion. Depending upon the number of angular positions obtainable by the multiplexer, a plurality of pages are thus recorded in the medium 10. When the maximum number of pages is recorded, the controller 50 then moves the medium 10 until the next adjacent section, or any next section of the medium 10 is aligned with the opening in mask 16. In this manner, multiple pages can be multiplexed onto individual sections of the medium 10 and multiple sections can be addressed by the controller 50.

When it is desired to read out data recorded in the medium 10, the controller 50 moves the shutter 31 into the signal beam 28 to block the signal beam 28 so that only the reference beam is on, and it signals the multiplexer 40 to the correct angular position. This reference beam then becomes a reconstructing beam with the same wavelength and angle as the reference beam, which is directed to the appropriate section of the recording medium, and reconstructs the recorded image through inverse transform lens 33 onto the detector array 35.

Using the Axicon 54 of the invention with the SLM 30, there is created an appropriate light distribution at the Fourier plane of the first Fourier lens 32. Each pixel from the SLM 30 has a phase change due to the presence of the axicon 54. That will make the intensity distribution spread in a ring at the Fourier transform plane. The actual diameter of the ring would be determined by the parameters of the axicon, namely the angle and index of refraction of the axicon 54. The high intensity peak coming from the SLM 30, if there was no axicon, is lowered and is more efficiently distributed through the crystal recording medium 10. Since the axicon 54 is a phase shift element, when the hologram is read with the reference beam, the CCD camera retrieves the digital information of the SLM 30. The phase change of the axicon 54 will have no contribution to the intensity value.

Figure 1C:
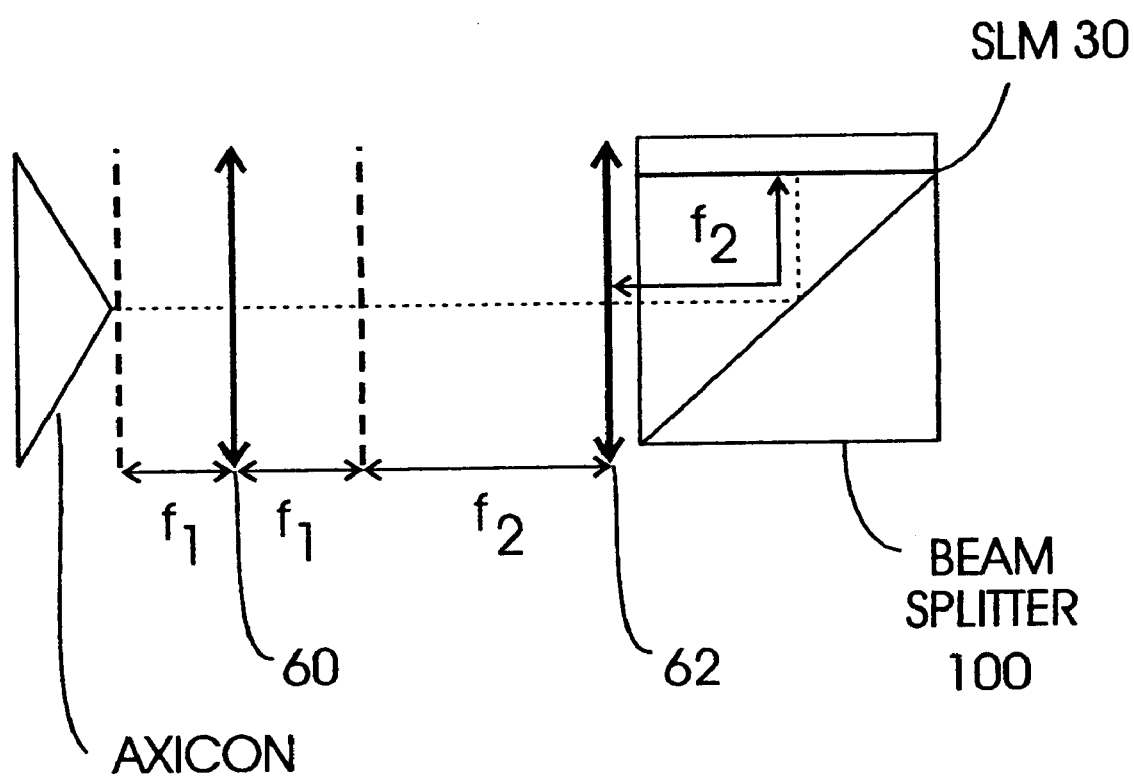

In the illustration of FIGS. 1a and 1b there is described a transmission SLM 30. In a different alternative, with a reflection SLM, the schematic setup of FIGS. 1a and 1b would change. The location of the axicon 54 relative to the SLM 30 would also be different. It is necessary to use a beam splitter cube 100 and lenses 60 and 62 so that the distance between the phase shifting element and the SLM is the sum of the focal length of the lenses, namely $2(f_1+f_2)$. This is shown in FIG. 1c.

It should be understood that the holographic storage system of FIG. 1a is typical of one of such holographic system, wherein the present invention finds its intended uses. Therefore, the present invention is not to be considered as being applicable or limited only to the holographic storage system described above, but to any holographic system wherein the previously discussed problems to which the present invention is directed are inherent therein.

Optical Correlation System

Figure 2:
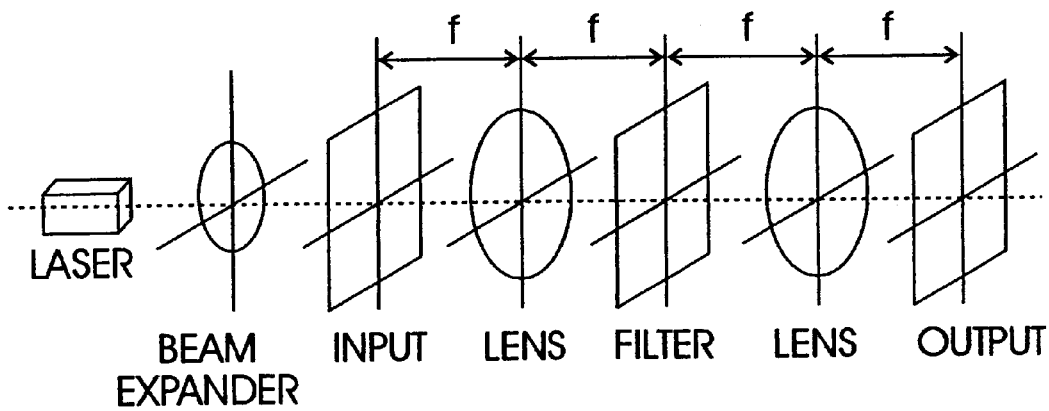
FIG. 2 illustrates a schematic block diagram illustrating the major components of a data processing system for optical correlation.

In FIG. 2 there are shown major components of a data processing system for optical correlation. The technique of optical correlation is based on the fact that a lens can perform a Fourier transform of a scene when coherent light is used. When the scene is transformed into the frequency domain, it can be manipulated by a filter constructed from a target so as to produce a correlation peak when the product is retransformed (again, with a lens). The position of the peak in the output is related to the input position of the target in the input scene, and if there is no target, there will be no peak. Object identification and tracking are two applications of optical correlation.

Figure 5A:
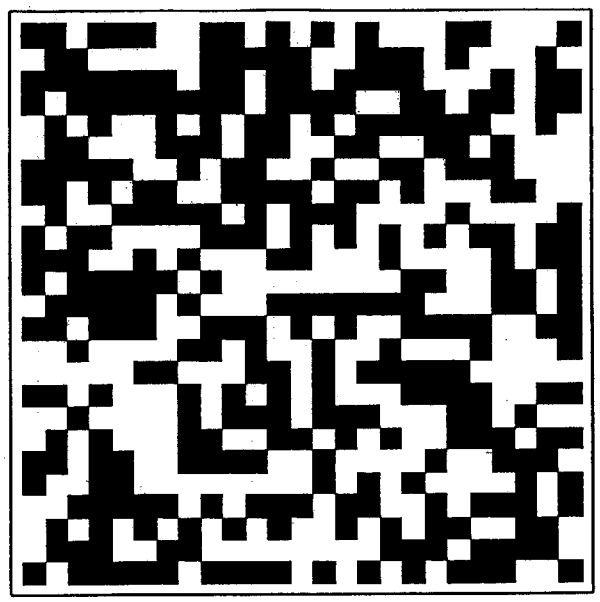
FIGS. 5a–5c illustrate an application of a random phase shifting element according to the prior art.
Figure 5B:
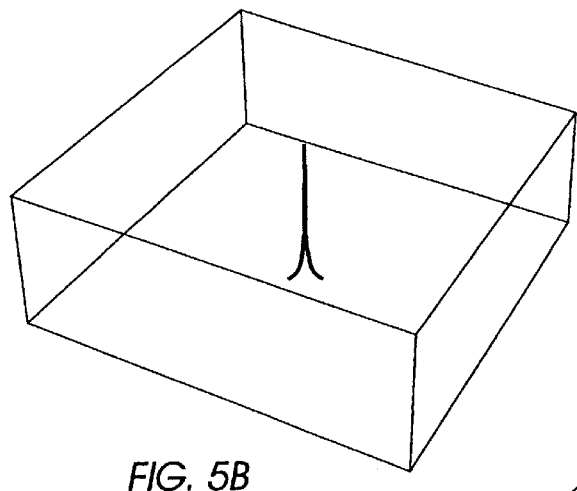
Figure 5C:
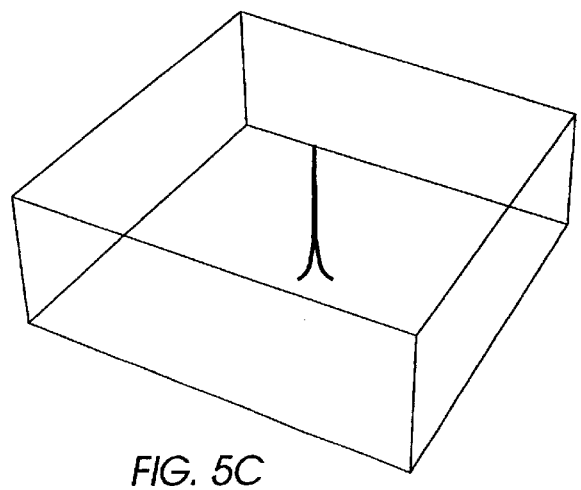

FIGS. 5a–5c show the improvement in the smoothing of the Fourier transform spectrum that can be achieved using a random phase shifting element as described in the prior art. FIG. 5a shows the distribution of random 0 and π discrete phase steps in the phase shifting element. Comparing FIGS. 5b and 5c, the light intensity is spread more evenly in the Fourier transform plane using the random phase shifting element with the peak intensity being reduced by about a factor proportional to the number of pixels in the data mask.

FIG. 5a shows a random phase shifting element; FIG. 5b shows the intensity of the Fourier spectrum of the phase shifting element; and FIG. 5c shows the intensity of the Fourier spectrum of the compound of data and phase shifting element.

Figure 6A:
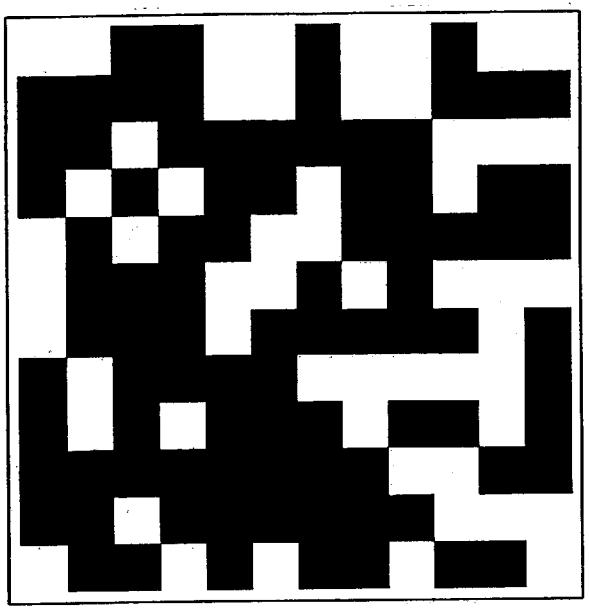
FIGS. 6a–6c illustrate an application of a linear phase shifting element wedge.
Figure 6B:
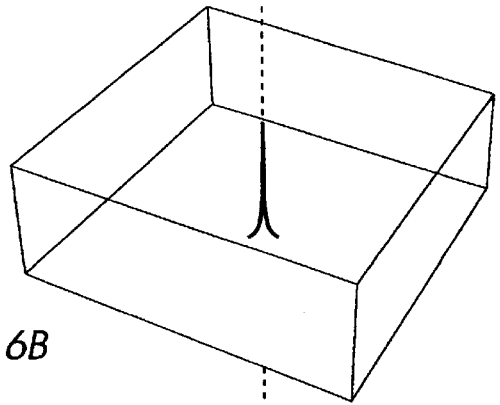
Figure 6C:
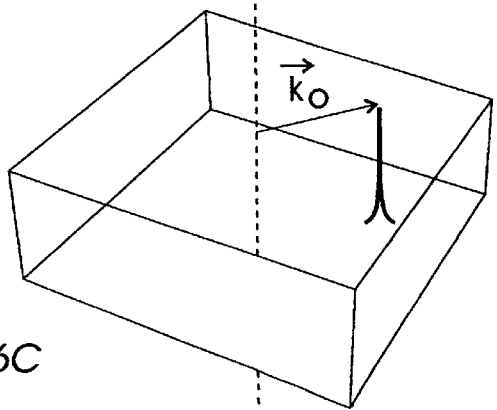

FIGS. 6a–6c illustrate one of the general principles of the invented linear phase shifting elements. FIG. 6a shows the transmission of light through a random data mask. FIG. 6b shows the intensity distribution in the Fourier transform plane from the data mask of a lens used in a holographic storage device. FIG. 6c shows the intensity of the Fourier spectrum of the compound of the data mask and a linear phase wedge. This wedge causes the intensity distribution to be displaced from its initial position by an amount which is proportional to the variation in height of the phase wedge.

Figure 7A:
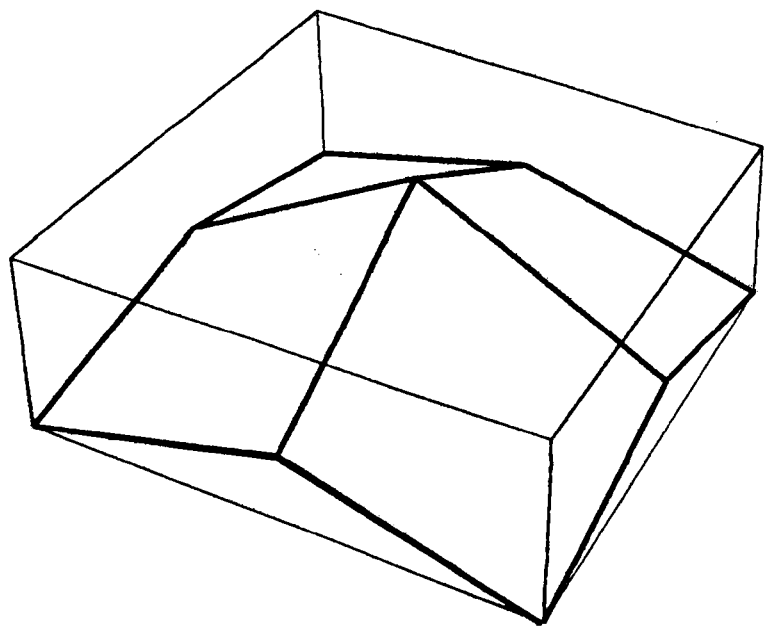
FIGS. 7a and 7b illustrate a 4-fold phase shifting element wedge.
Figure 7B:
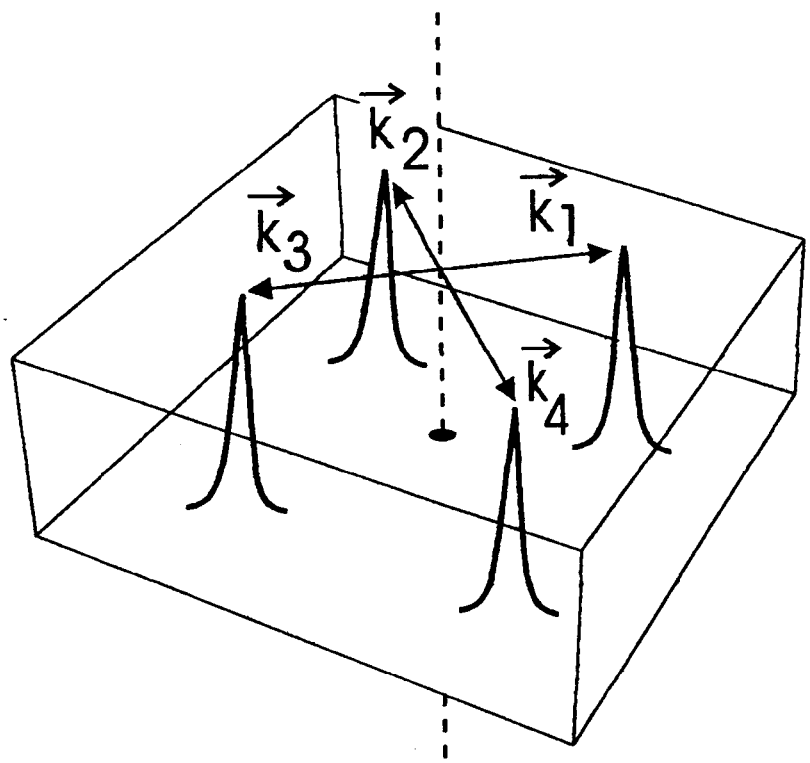

The principle of the phase wedge can be used to distribute the intensity more uniformly in the Fourier transform plane. For example, FIGS. 7a and 7b show an embodiment of the phase wedge design. FIG. 7a shows a 4-fold phase shifting element wedge of a pyramidal design. Each facet of the pyramid displaces the Fourier spectrum by an amount proportional to the variation in height of the wedge and in a direction determined by the direction cosine of the angle of the wedge with respect to the plane of the data mask, as is shown in FIG. 7b. FIG. 7a is phase distribution of the wedge in the object plane and FIG. 7b shows the intensity of the Fourier spectrum of the wedge.

Figure 8A:
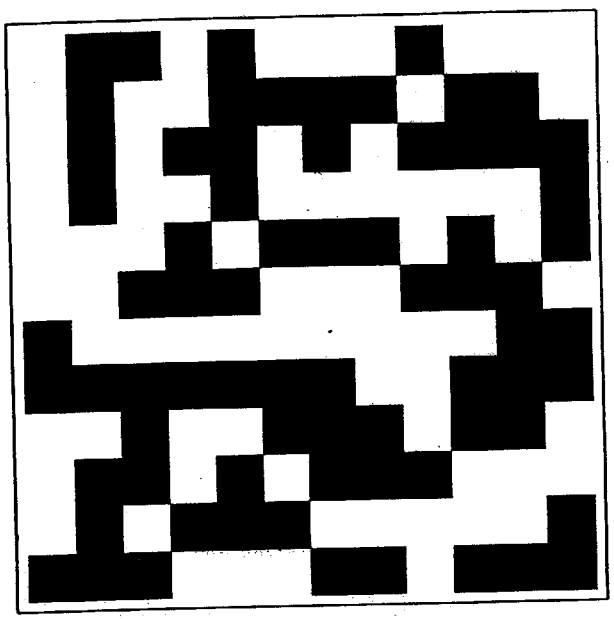
FIGS. 8a–8c illustrate an application of a 4-fold phase shifting element wedge.
Figure 8B:
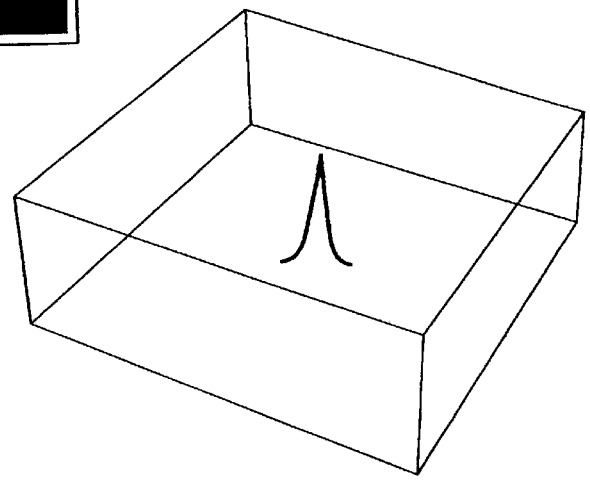
Figure 8C:
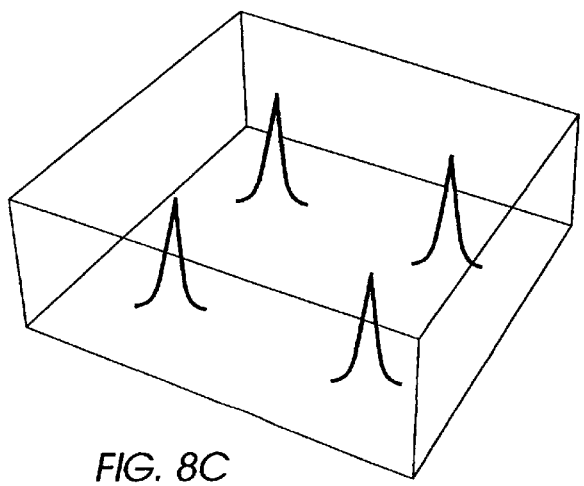

FIGS. 8a–8c demonstrate the improved performance of this 4-fold phase shifting element wedge with a random data mask, which shows the intensity of the Fourier spectrum of the data mask without and with the 4-fold phase shifting element. Comparing FIGS. 8b and 8c, the light intensity is spread more evenly in the Fourier transform plane using the wedge as compared to the distribution without a wedge. The intensity spikes are broadened and the peak intensities have been reduced, which is desirable for holographic data storage application.

Figure 9A:
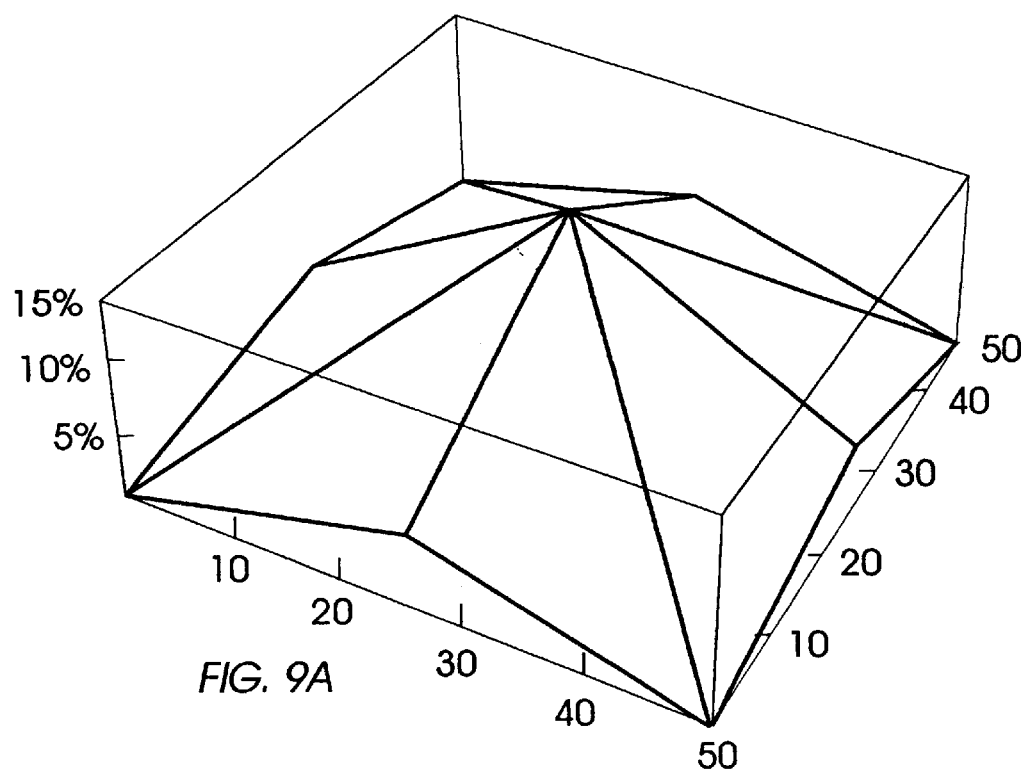
FIGS. 9a and 9b illustrate an 8-fold phase shifting element wedge.
Figure 9B:
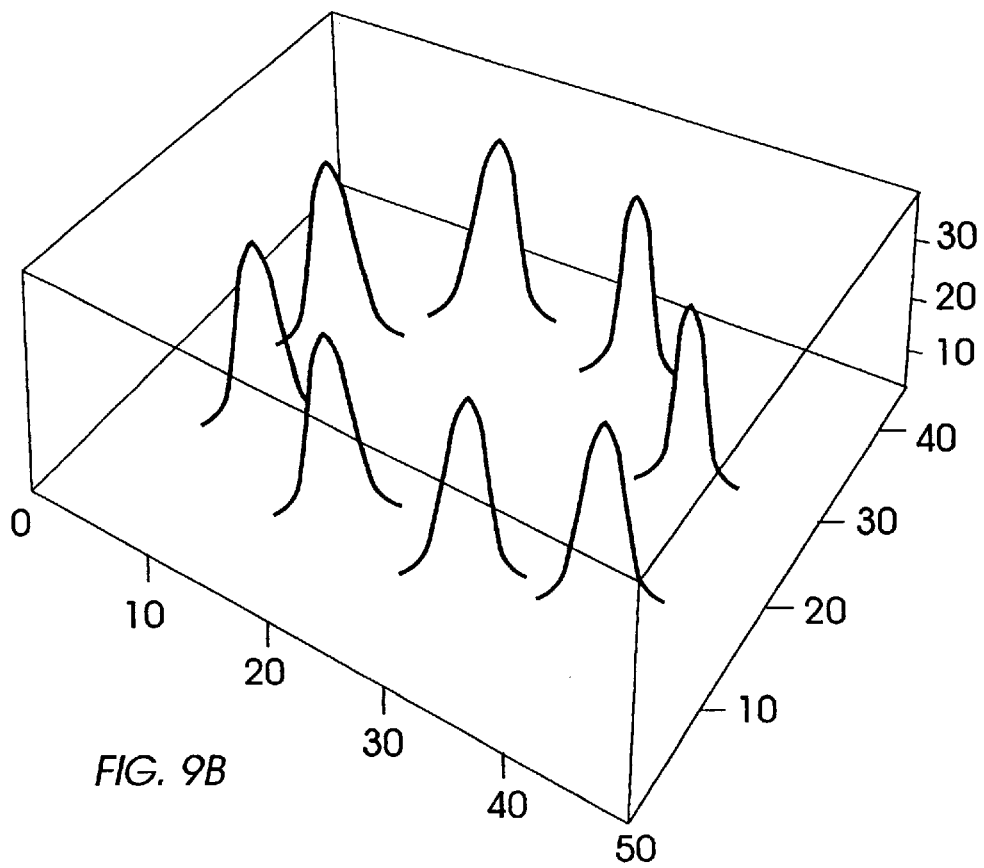

FIGS. 9a and 9b show a second embodiment of the phase wedge. It is an 8-fold phase wedge as illustrated in FIG. 9a. The effect of this wedge on the Fourier spectrum is shown in FIG. 9b. FIG. 9a shows a phase distribution of the wedge in the object plane; and FIG. 9b shows the intensity of the Fourier spectrum of the wedge.

Figure 10A:
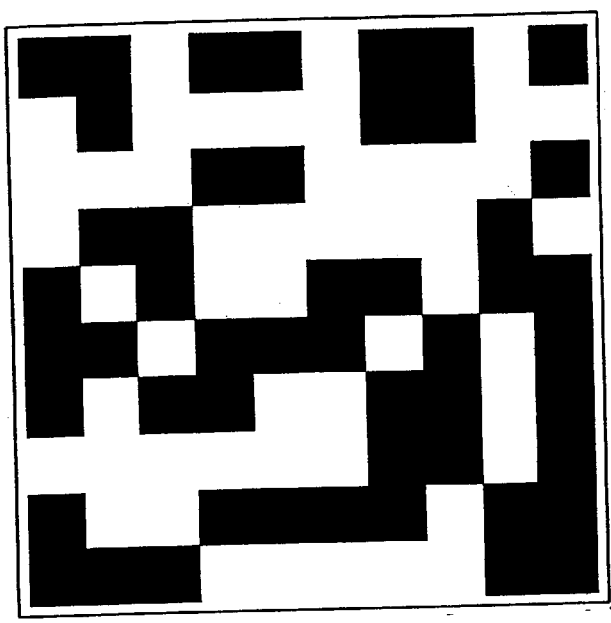
FIGS. 10a–10c illustrate an application of an 8-fold phase shifting element wedge.
Figure 10B:
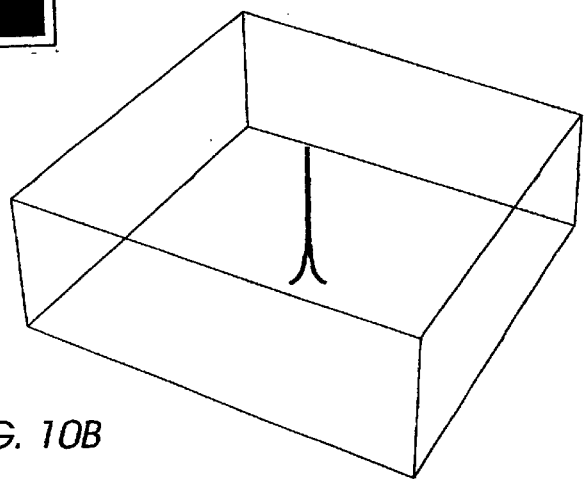
Figure 10C:
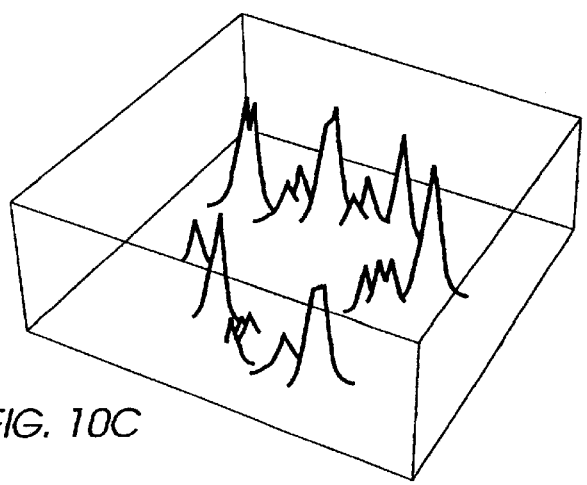

FIGS. 10a–10c demonstrate the improved performance of this 8-fold phase shifting element wedge with a random data mask. Comparing FIGS. 10b and 10c, the light intensity is spread more evenly in the Fourier transform plane using the 8-fold wedge as compared to the distribution without the wedge. The intensity spikes are broadened and the peak intensities have been reduced. In addition, the performance of this 8-fold wedge is superior to the 4-fold wedge. FIG. 10a shows a random data matrix; FIG. 10b shows the intensity of the Fourier spectrum of the data mask; and FIG. 10c shows the intensity of the Fourier spectrum of the compound of phase and data mask.

Figure 11A:
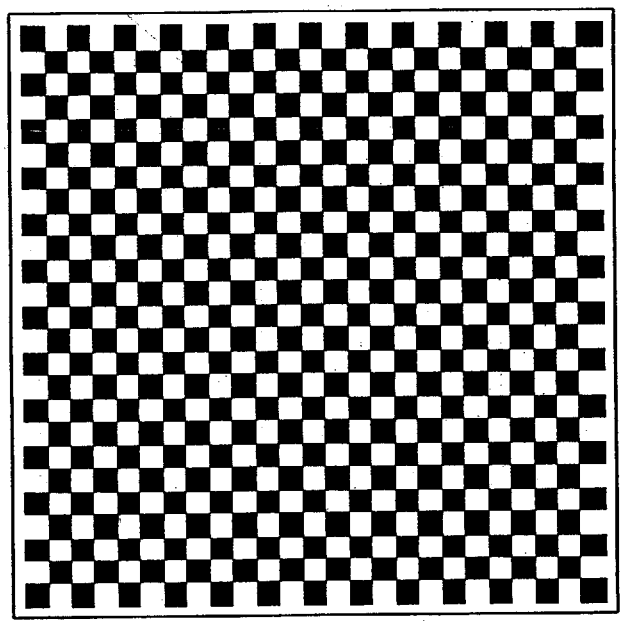
FIGS. 11a–11c illustrate an application of checkerboard phase shifting element.
Figure 11B:
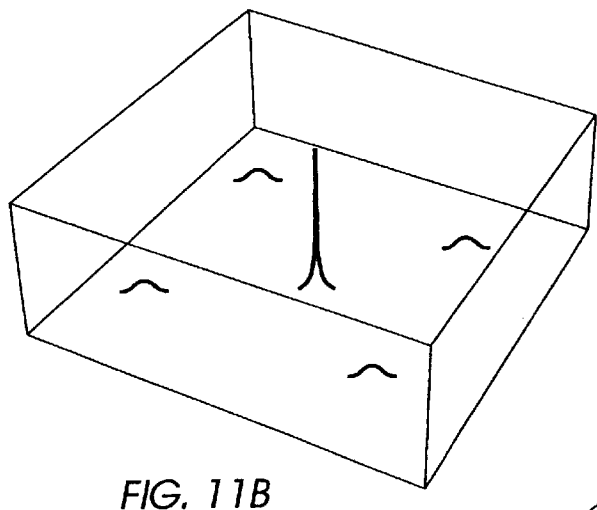
Figure 11C:
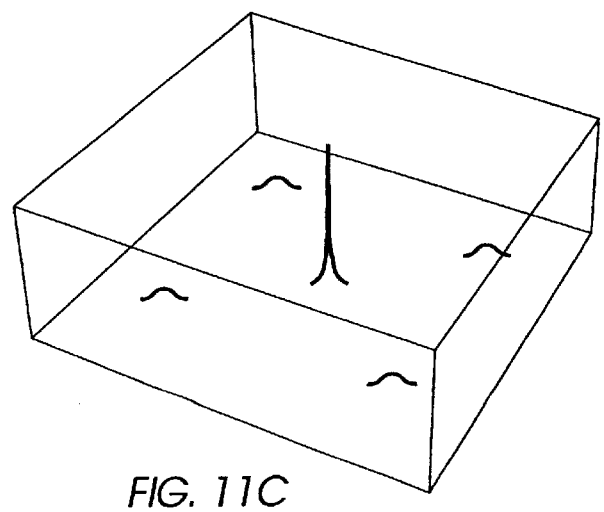

FIGS. 11a–11c show the effect of a checkerboard phase shifting element on the intensity distribution at the Fourier transform plane. In FIG. 11a, the phase shifting element with alternating phase steps of 0 and π is shown. Comparing FIGS. 10b and 10c, the peak light intensity is more reduced than when a checkerboard phase shifting element is used. The phase contrast is π. FIG. 11a shows a phase distribution of the checkerboard phase shifting element; FIG. 11b shows the intensity of the Fourier spectrum of the checkerboard phase shifting element; and FIG. 11c shows the intensity of the Fourier spectrum of the compound of the phase and data mask.

FIGS. 12a–12c show the third embodiment of the phase shifting element which combines the 4-fold phase wedge with the checkerboard phase shifting element. These give a substantial reduction in intensity over the case where no phase shifting element is used. The checkerboard phase contrast is π. FIG. 12a shows a phase shifting element with large pixels; FIG. 12b shows a phase distribution of the compound of phase and data mask; and FIG. 12c shows the intensity of the Fourier spectrum of the compound of phase and data mask.

Figure 13A:
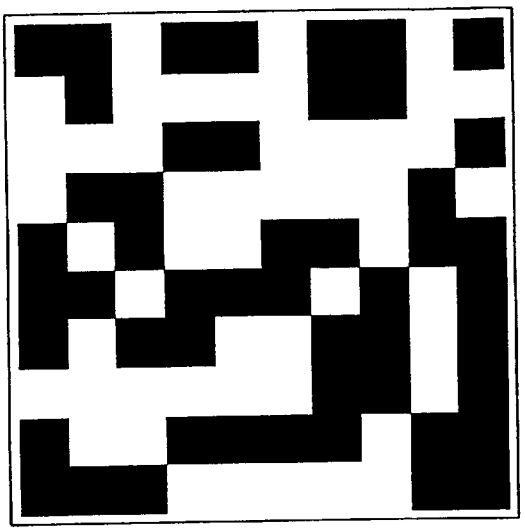
FIGS. 13a–13c illustrate an application of the 8-fold phase shifting element wedge in combination with the checkerboard phase shifting element.
Figure 13B:
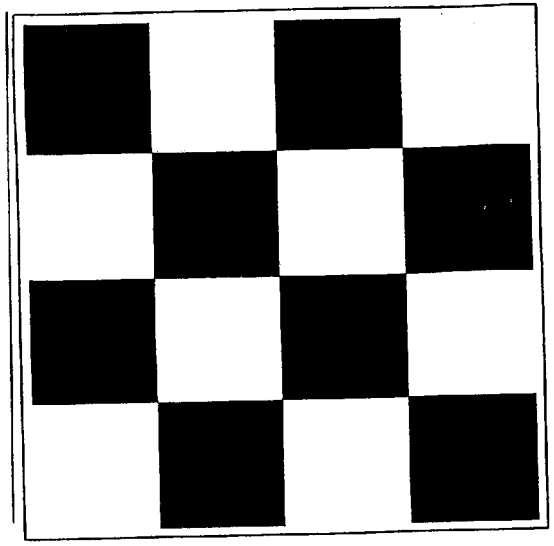
Figure 13C:
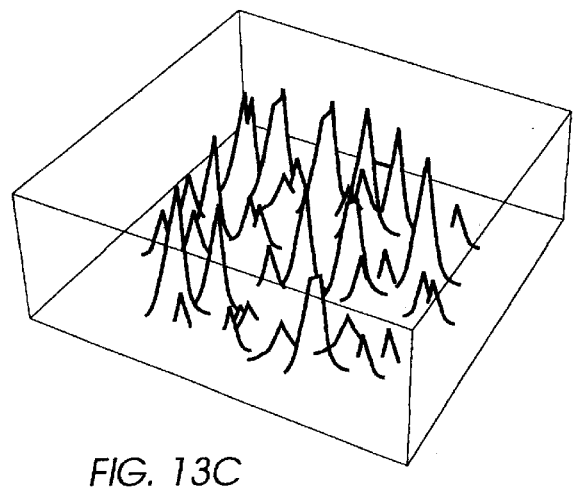

FIGS. 13a–13c show the improvement produced when the 8-fold phase wedge and the checkerboard phase shifting element are combined. These give a reduction in intensity larger than in the case shown in FIG. 11. The checkerboard phase contrast is π. FIG. 13a shows a random data matrix; FIG. 13b shows a phase distribution of the compound of phase and data mask; and FIG. 13c shows the intensity of the Fourier spectrum of the compound of phase and data mask.

Figure 14A:
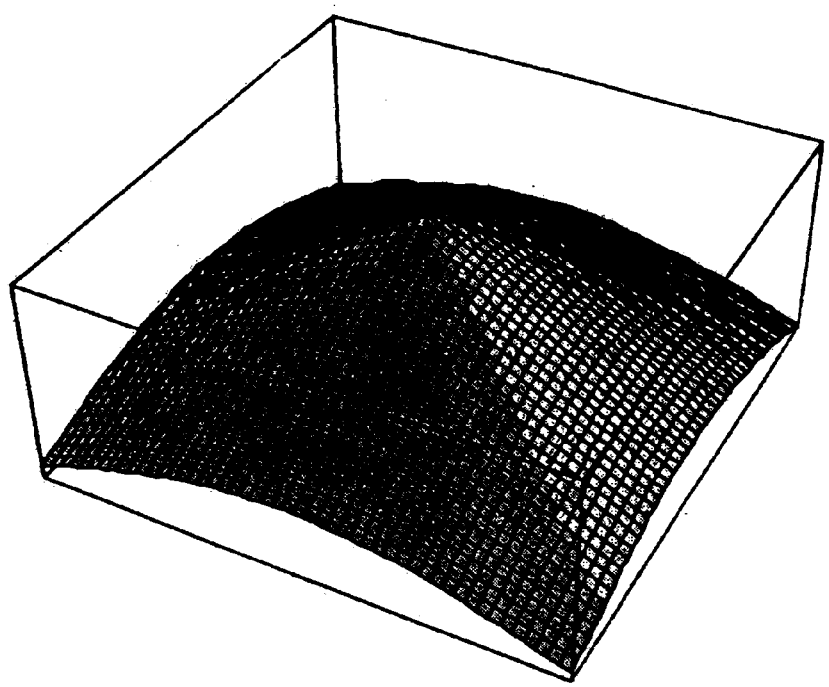
FIGS. 14a and 14b illustrate a phase axicon.
Figure 14B:
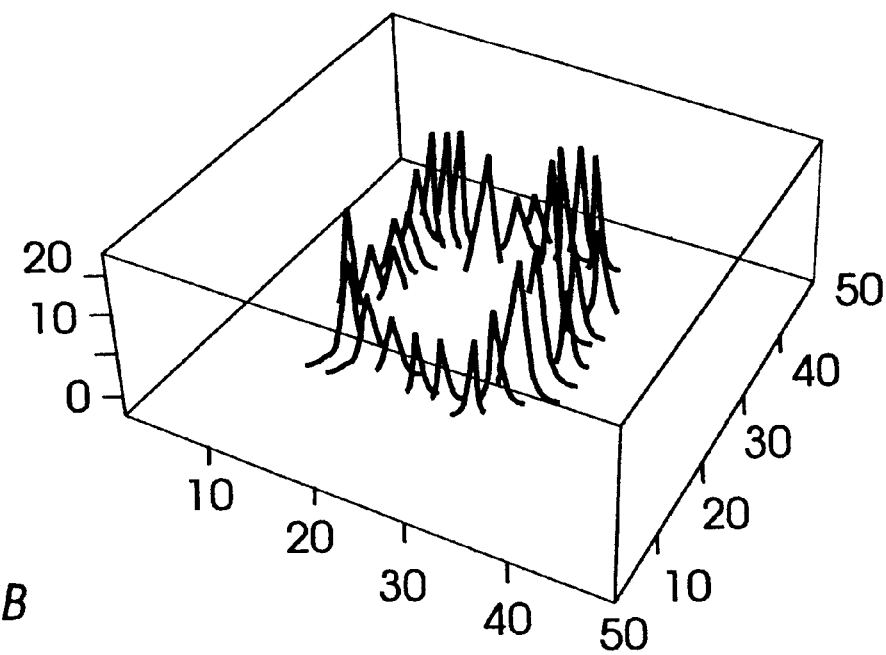

FIGS. 14a–14b show a the third embodiment of the phase shifting element. It is a phase axicon as illustrated in FIG. 14a. The Fourier spectrum of this axicon is shown in FIG. 14b. Light is distributed in an annular shape along the Fourier spectrum. FIG. 14a shows the phase distribution of the axicon in the object plane; and FIG. 14b shows the intensity of the Fourier spectrum of the axicon.

Figure 15A:
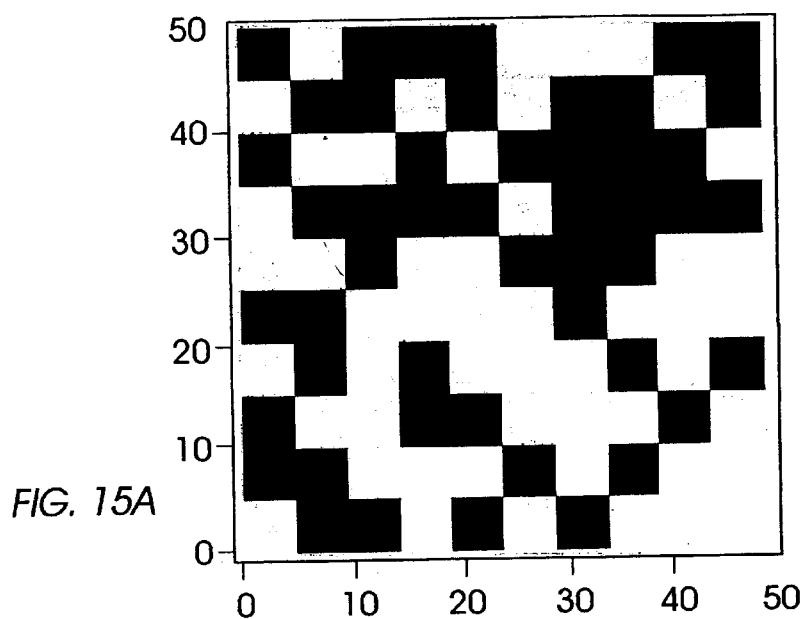
FIGS. 15a–15c illustrate an application of a phase axicon.
Figure 15B:
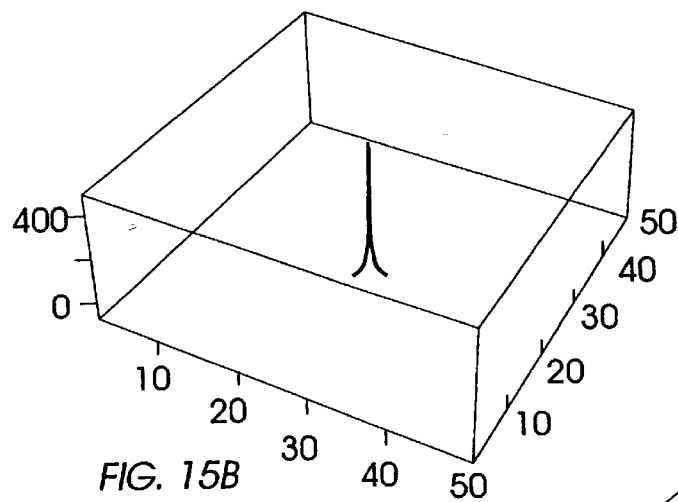
Figure 15C:
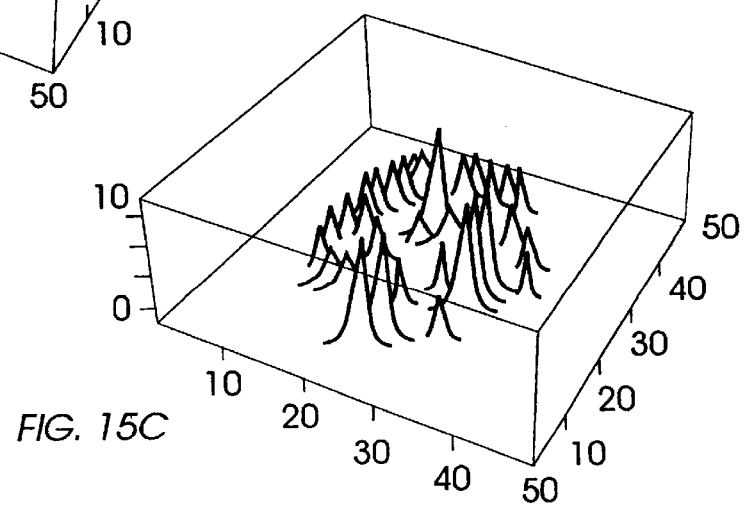

FIGS. 15a–15c demonstrate the improved performance of this phase axicon with a random data mask. As can be seen from FIGS. 15b and 15c, the dc intensity peak in the Fourier spectrum of the data mask is more evenly distributed with the incorporation of the axicon. FIG. 15a shows a random data mask; FIG. 15b shows the intensity of the Fourier spectrum of the data mask; and FIG. 15c shows the intensity of the Fourier spectrum of the compound.

Figure 16A:
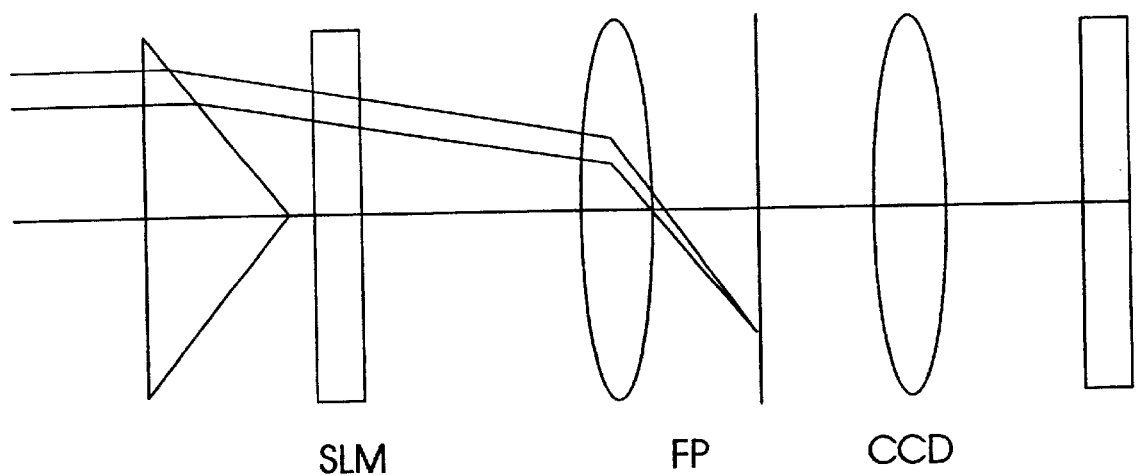
FIGS. 16a–16c illustrate the axicon concept.
Figure 16B:
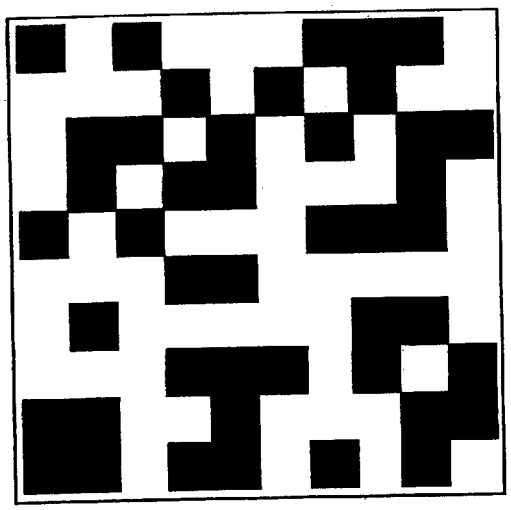
Figure 16C:
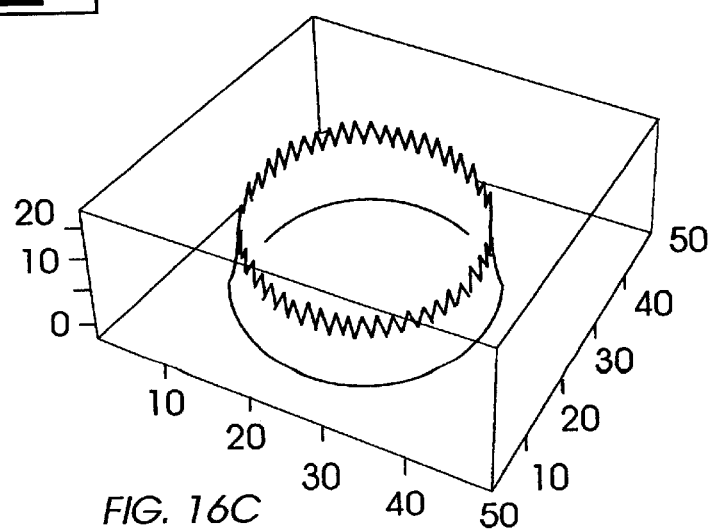

FIGS. 16a–16c illustrate the axicon concept. In FIG. 16a there is shown the experiment set up in two planes. There is sequentially the axicon, a SLM, a lens, the Fourier plane in the hologram storage medium, a reconstruction lens and the reconstructed digital page as measured on a CCD camera. At the Fourier plane, the data has been subjected to both a linear plane shift and revolution symmetry as further seen in FIG. 16c. It can be seen that cross-section axicon is formed by straight edges. The upstream side as shown in FIG. 16c is relatively a straight edge, and, in this situation, the axicon is a solid member. In its optimum state, the axicon would be a conical construction which thereby provides an infinite number of prisms, or phase shifting elements.

Figure 4A:
FIGS. 4a–4h illustrate a variety of different devices which could operate as phase shift devices.
Figure 4E:
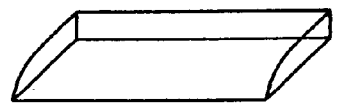
Figure 4B:
Figure 4F:
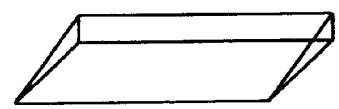
Figure 4C:
Figure 4G:
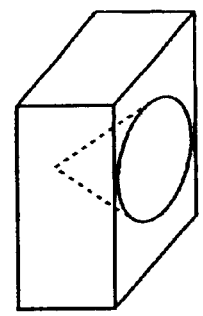
Figure 4D:
Figure 4H:

As illustrated in FIGS. 4a–4h multiple other kinds of prismatic devices can be used. In fact, the axicon can have more than one angle, namely, a steeper angle and a flatter angle or several different angular relationships with regards to its flat face. This is illustrated in FIGS. 4a,b. In FIG. 4a the relationship can be a steeper angle followed by a flatter angle. In FIG. 4b the relationship can be a flatter angle followed by a stepper angle at the central portion. In different arrangements there can be different arrangements of steeper and flatter angles as required in a random or regulated manner. These are illustrated in FIGS. 4c and 4d. The axicon as described is substantially a circular prismatic element which provides for revolution symmetry about the optical axis. In other cases, there can be a rectangular prismatic element as illustrated in FIGS. 4e and 4f. These rectangular prismatic elements can be arranged with different configurations of steep angle and flat angle. Further, the prismatic elements can be that of a Fresnel type lens, as illustrated in FIG. 4d, or piecewise continuous, as illustrated in FIG. 4h. These two types can also be configured into the circular prismatic element arrangement as described.

As illustrated in FIG. 4g, the prismatic elements can be negative elements. In that sense, the axicon can have a configuration where there is an indentation towards a central point rather than a protrusion to that central point. The requirement of the phase shifting element in cooperation with the SLM is to effect the reduction of the peaks of energy which would otherwise be present. This is done by dispersing the peaks from a centralized location to multiple peaks of lesser intensity throughout the crystal. These peaks ideally can be distributed in one or more circular formats around a centralized point. These formats could be termed doughnut around the central axis and, in some cases, they may not appear to be separate circular formations if multiple circular dispersions are provided by the interaction of the phase shifting element with the SLM.

Relationship of the SLM and Phase Shifting Device

FIG. 1c illustrates a schematic setup of the location of an axicon when a reflective SLM is used.

Figure 3:
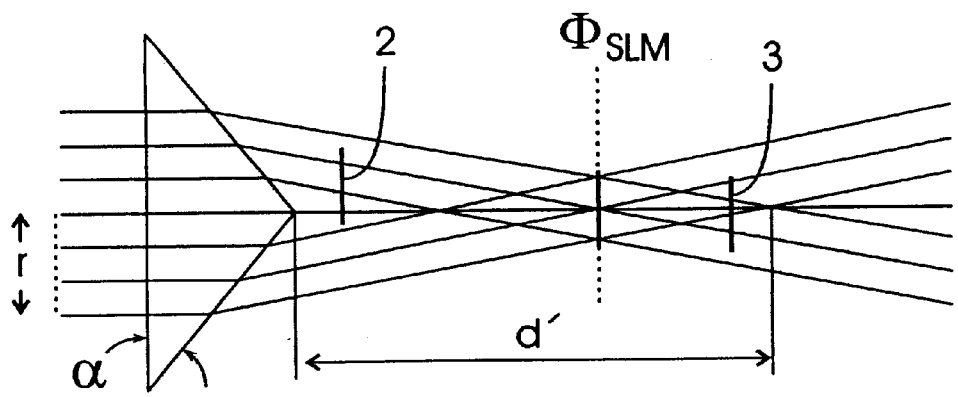
FIG. 3 is an illustration of a data mask in relation to an SLM illustrating different light paths through the phase shifting device and the SLM so that the location of the SLM relative to the phase shifting device can be determined.

FIG. 3 illustrates the parameters which will determine the location of the phase shifting device relative to the SLM and the data mask. Contrary to the case of prior to art phase step masks, the novel phase shifting elements do not need to be in close proximity to the SLM. It has to be located in such a way that every SLM pixel is fully and uniformity illuminated by the wavefront transmitted or reflected by the phase shifting element, and so that the phase across every pixel is a linear function of the distance with a slope different than zero. The tolerance region of the location of the SLM with respect to the axicon can be expressed as:

$$d' = \frac{r}{(n-1)\alpha}$$

where r is the radius of the outermost ray entering the axicon, n is the index of refraction of the axicon, and α is the angle of the axicon. Because of alignment issues and symmetry properties, the SLM should be centered to the system optical axis. However, there is no physical reason not to put it somewhere else as long as it is uniformity illuminated by the phase shifting element wavefront. Some of these locations are shown in FIG. 3 (indicated as 2 and 3).

Figure 17:
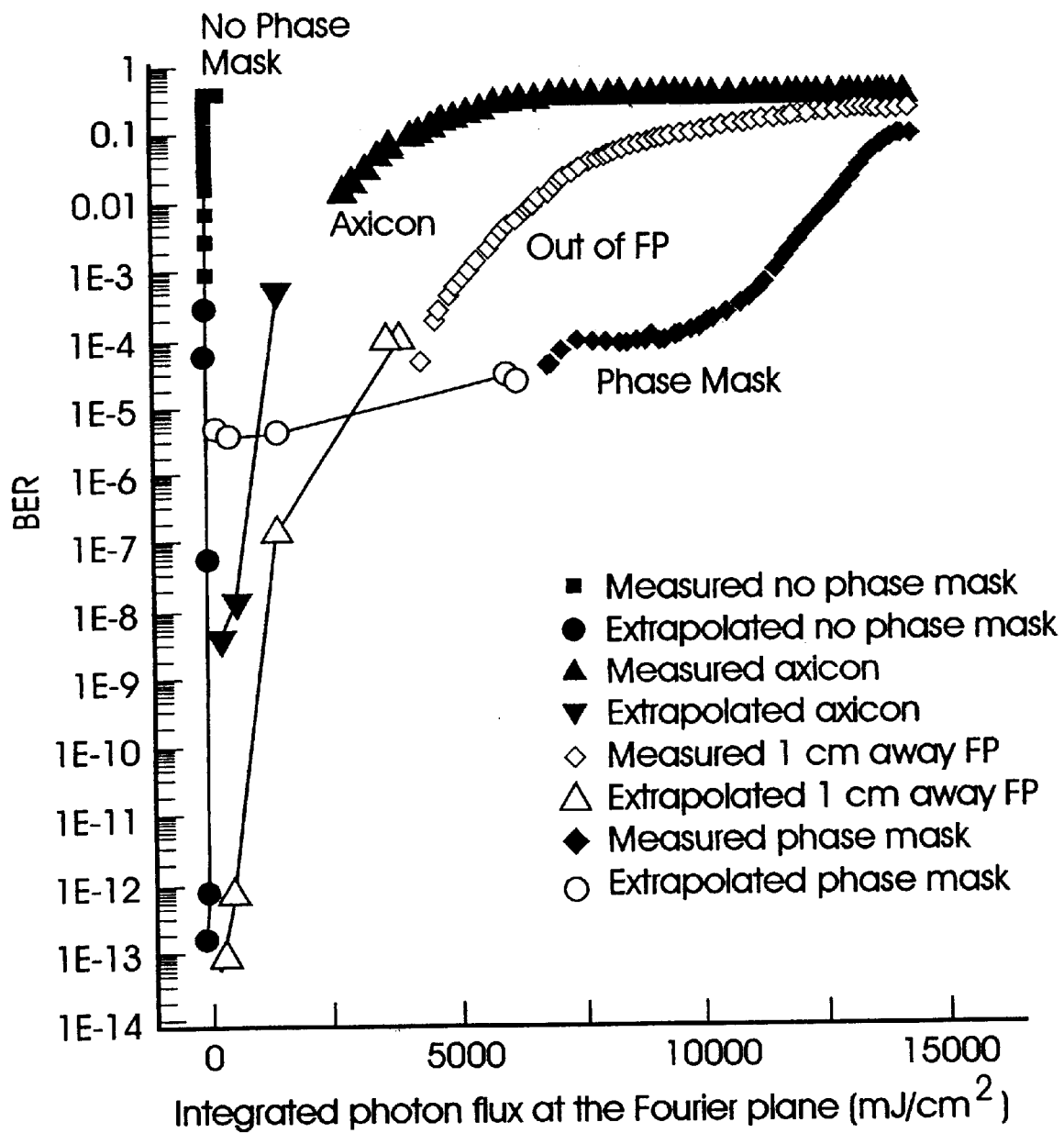
FIG. 17 illustrates comparative images using a $L_1NbO_3$:Fe crystal storage medium.

Data Comparisons In FIG. 17, there is set out the comparison of the data as processed without a phase step element, with a phase step element, measured out of the Fourier plane and measured at the Fourier plane with an axicon. As can be seen with the axicon, there is a high accumulation of energy in the Fourier plane (contained by the crystal) and a minimum probability of error. The axicon system provides for a simpler set up relative to the prior art, a hologram which occupies a large volume of the crystal, and translational invariance.

The invention can operate with multiple different forms of storage mediums. These masks are for use in holographic storage devices. The invented technology has use in optical holographic data storage, video servers, or military applications.

The phase shifting element designs of the invention are superior to previous designs, since they are versatile enough to correct the problems associated with different SLM designs. The phase shifting elements are simpler to manufacture. The alignment and registration with the SLM are also simpler. Other phase shifting elements can be placed in the vicinity of the SLM without degrading the image quality.

The phase shifting elements are inexpensive to produce, and the invented phase shifting elements are expected to be a critical component in the success of holographic optical data storage.

This invention may be embodied in other specific forms without departing from its spirit or essential characteristics. The above-described embodiments of the present invention are to considered in all respects only as illustrative and not restrictive in scope. The scope of the invention is, therefore, indicated by the appended claims rather than by the above-detailed description. Therefore, all changes which come within the meaning and range of equivalency of the claims are to be considered embraced within their scope.

What is claimed is:

1. A holographic data storage system comprising:

a light source for generating a coherent light beam;

beam-forming optics for forming the coherent beam into a collimated coherent beam along an optical axis;

a spatial light modulator located in the path of the beam from the beam-forming optics and having an array of regularly spaced pixels for generating individual beams of light from the coherent beam;

a holographic recording medium;

a Fourier transform lens located between the modulator and the medium and centered on the optical axis for directing the individual beams to the medium, the medium being located substantially in the Fourier transform plane where relatively high intensity spikes from the individual beams generated by the regularly spaced modulator pixels are concentrated; and a plurality of optical elements located between the beam-forming optics and the modulator and spaced around the optical axis of the collimated coherent beam from the beam-forming optics, the surface of each of the plurality of optical elements having a shape such that a sectional plane of the optical element in which the optical axis also lies defines a straight line oriented at a nonperpendicular angle to the optical axis, the optical elements directing the beam to the modulator as portions of light nonparallel to one another and to the optical axis, thereby imparting to each light portion a phase shift linearly proportional to the distance of the light portion from the optical axis, whereby the portions of light from the modulator are also nonparallel to one another and the intensity of the spikes in the Fourier transform plane is thereby substantially reduced.

2. The system of claim 1 wherein the plurality of optical elements comprises an axicon having its axis of rotational symmetry coincident with the optical axis.

3. The system of claim 2 wherein the axicon is an optical element having a conically-shaped recess with the axis of rotational symmetry of said recess being coincident with the optical axis.

4. The system of claim 1 wherein the plurality of optical elements comprises a plurality of generally concentric annular conical sections, each annular conical section having its axis of rotational symmetry coincident with the optical axis.

5. The system of claim 1 wherein the plurality of optical elements comprises a plurality of wedges symmetrically spaced around the optical axis, the planar light exiting surface of each wedge being nonparallel to the optical axis.

6. The system of claim 1 wherein the plurality of optical elements comprises a plurality of wedges, each of the plurality of wedges having its planar light exiting surface oriented at a unique angle relative to the optical axis, whereby the portion of light exiting each wedge strikes the modulator at an angle different from the portions of light from the other wedges.

7. A holographic data storage system comprising:

a light source for generating a coherent light beam;

beam-forming optics for forming the coherent beam into a collimated coherent beam along an optical axis;

a spatial light modulator located in the path of the beam from the beam-forming optics and having an array of regularly spaced pixels for generating individual beams of light from the coherent beam;

a holographic recording medium;

a Fourier transform lens located between the modulator and the medium and centered on the optical axis for directing the individual beams to the medium, the medium being located substantially in the Fourier transform plane where relatively high intensity spikes from the individual beams generated by the regularly spaced modulator pixels are concentrated; and an axicon having its axis of rotational symmetry coincident with the optical axis for directing the coherent beam to the modulator as portions of light nonparallel to the optical axis, whereby the intensity of the spikes is substantially reduced.

* * * * *